(12) United States Patent
Wang et al.

(10) Patent No.: US 8,247,882 B2
(45) Date of Patent: Aug. 21, 2012

(54) METHOD OF FORMING AN ISOLATION STRUCTURE

(75) Inventors: Ching-Chun Wang, Tainan (TW); Tzu-Hsuan Hsu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 13/009,354

(22) Filed: Jan. 19, 2011

(65) Prior Publication Data
US 2011/0115048 A1    May 19, 2011

Related U.S. Application Data

(62) Division of application No. 12/357,094, filed on Jan. 21, 2009, now Pat. No. 7,897,477.

(51) Int. Cl.
*H01L 29/00* (2006.01)

(52) U.S. Cl. ............... 257/506; 257/522; 257/E23.002; 257/E29.02

(58) Field of Classification Search .................. 257/506, 257/522, E23.002, E29.02
See application file for complete search history.

(56) References Cited

U.S. PATENT DOCUMENTS
2005/0212071 A1   9/2005   Yue et al.
2009/0184357 A1   7/2009   Wu

*Primary Examiner* — David S Blum
(74) *Attorney, Agent, or Firm* — Haynes and Boone, LLP

(57) ABSTRACT

Provided is a method of fabricating a semiconductor device that includes providing a semiconductor substrate having a front side and a back side, forming a first circuit and a second circuit at the front side of the semiconductor substrate, bonding the front side of the semiconductor substrate to a carrier substrate, thinning the semiconductor substrate from the back side, and forming an trench from the back side to the front side of the semiconductor substrate to isolate the first circuit from the second circuit.

20 Claims, 5 Drawing Sheets

METHOD OF FORMING AN ISOLATION STRUCTURE

PRIORITY DATA

This application claims priority to application Ser. No. 12/357,094, now U.S. Pat. No. 7,897,477, filed on Jan. 21, 2009, entitled "METHOD OF FORMING AN ISOLATION STRUCTURE," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

The scaled down semiconductor ICs have been used in a variety of applications. In some applications, the ICs may include both noisy devices such as high speed digital circuits and noise-sensitive devices such as analog or radio frequency (RF) circuits. When a noisy device and a noise-sensitive device are placed in a substrate together, particularly if they are placed in proximity of each other, the noise produced by the noisy device may adversely affect the performance of the noise-sensitive device. The noisy device may generate noise due to high speed switching, which then may be coupled to the noise-sensitive device through the substrate. One approach utilizes doped isolation features to isolate the devices from each other. Although this approach has been satisfactory for its intended purpose, it has not been satisfactory in all respects. For example, it requires additional photomask (or reticle) for the implantation process, and may still suffer from noise due to a capacitor coupling effect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
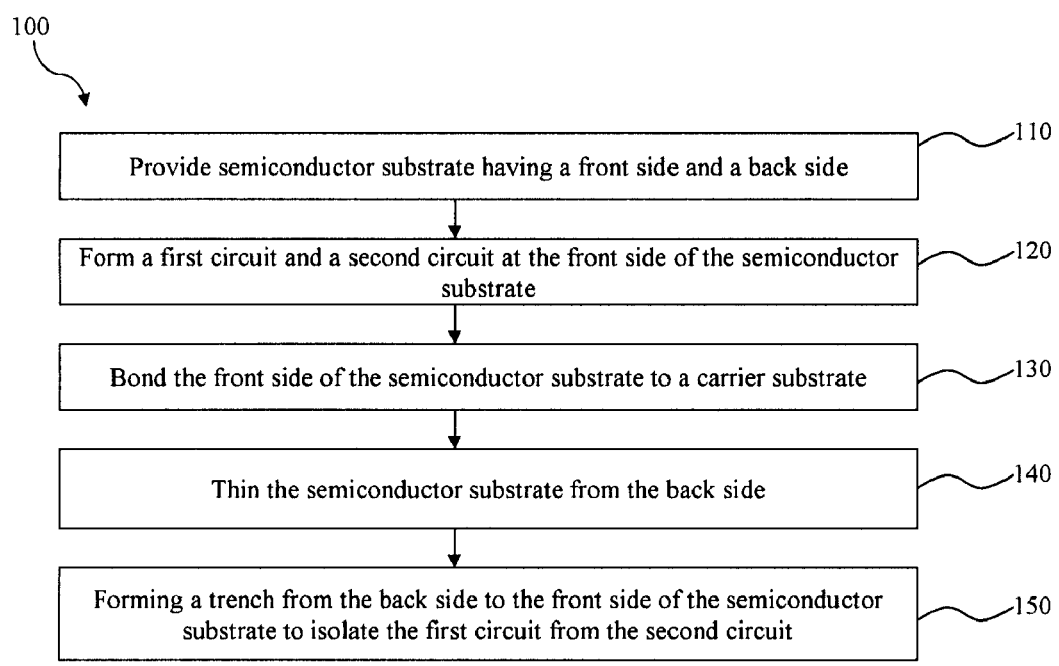
FIG. 1 is a flowchart illustrating a method of fabricating a semiconductor device with an isolation structure according to various aspects of the present disclosure.
Figure 2A:
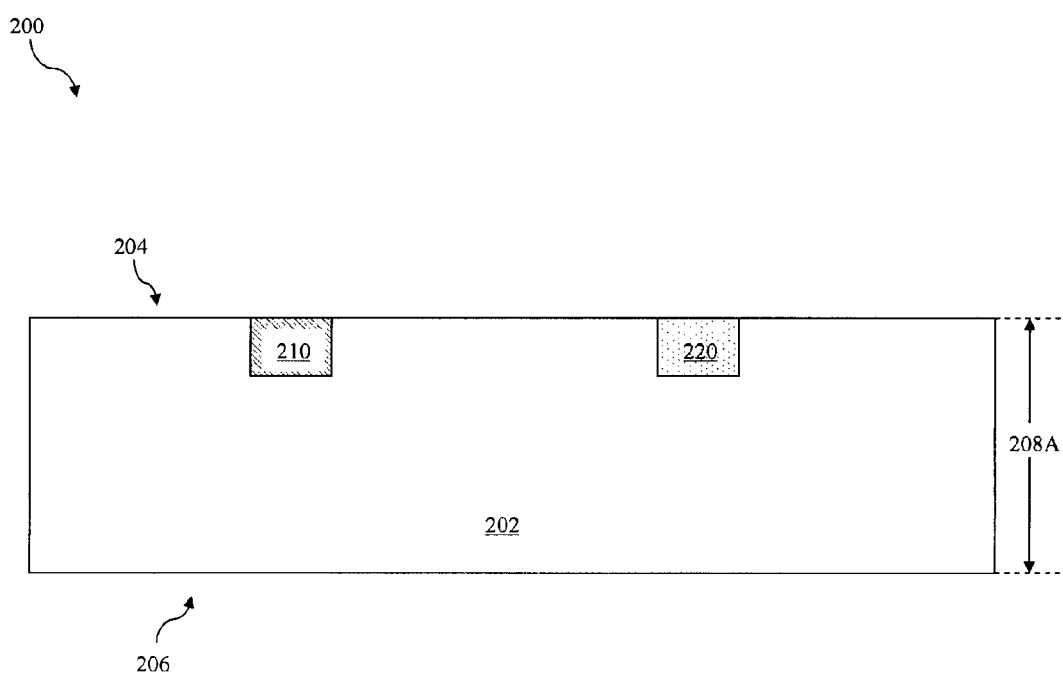
FIGS. 2A-2C are cross-sectional views of a semiconductor device at various stages of fabrication according to the method of FIG. 1.
Figure 2B:
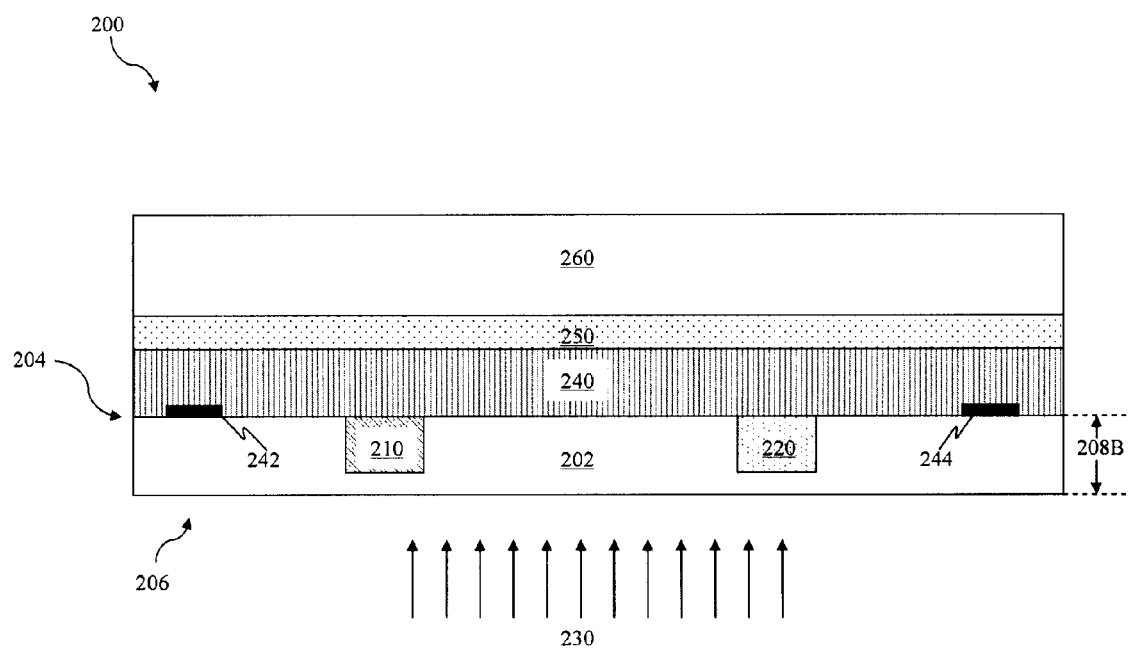
Figure 2C:
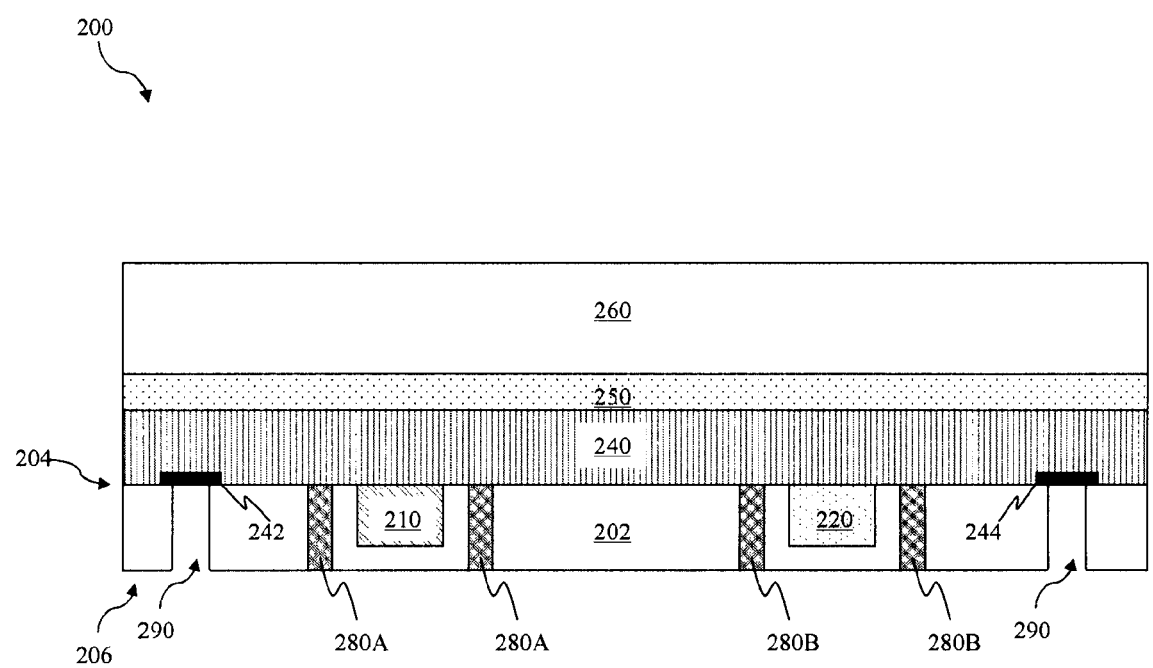
Figure 2D:
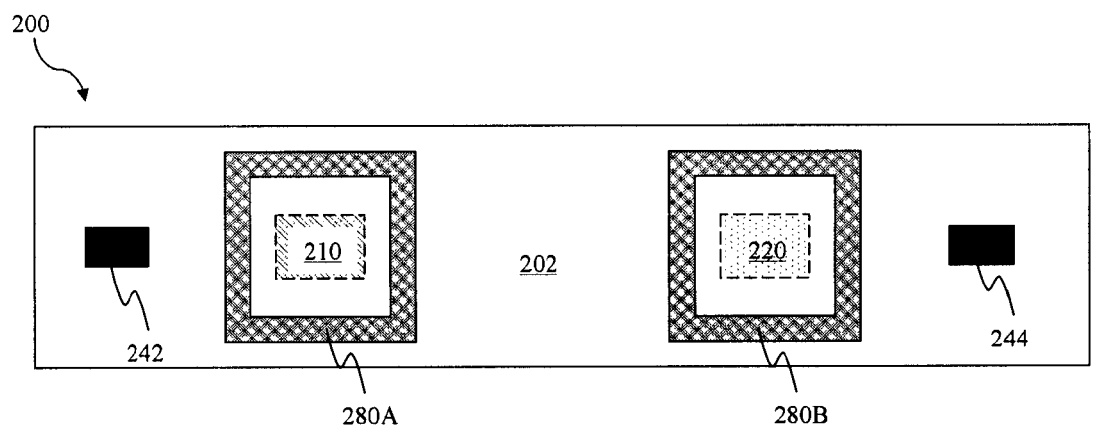
FIG. 2D is a bottom view of the semiconductor device at an intermediate stage of fabrication according to the method of FIG. 1.

Illustrated in FIG. 1 is a flowchart of a method 100 of fabricating a semiconductor device with an isolation structure according to various aspects of the present disclosure. FIGS. 2A to 2C are cross-sectional views of one embodiment of a semiconductor device 200 at various stages of fabrication according to the method 100 of FIG. 1. Also, FIG. 2D is a bottom view of the semiconductor device 200 at an intermediate stage of fabrication according to the method of FIG. 1. The semiconductor device 200 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2A to 2D have been simplified for a better understanding of the inventive concepts of the present disclosure. Accordingly, it should be noted that additional processes may be provided before, during, and after the method 100 of FIG. 1, and that some other processes may only be briefly described herein.

Referring to FIG. 1, the method 100 begins with block 110 in which a semiconductor having a front side and a back side is provided. Referring to FIG. 2A, the semiconductor device 200 includes a semiconductor substrate 202. The substrate 202 may also be referred to as a device substrate. The substrate 202 has a front side 204 and a back side 206. In the present embodiment, the substrate 202 is a silicon substrate and includes various doping configurations (e.g., N-wells or P-wells) depending on design requirements as is known in the art. In other embodiments, the substrate 202 may include other elementary semiconductors such as germanium and diamond. Alternatively, the substrate 202 may include a compound semiconductor and/or an alloy semiconductor. Further, the substrate 202 may optionally include an epitaxial layer (epi layer), may be strained for performance enhancement, and may include a silicon-on-insulator (SOI) structure. The substrate 202 has an initial thickness 208A that ranges from about 100 um to about 3000 um. In the present embodiment, the initial thickness 208A is about 700 um.

The method 100 continues with block 120 in which a first circuit and a second circuit are formed at the front side of the semiconductor substrate. As previously noted, the semiconductor device 200 includes various microelectronic devices formed at the front side 204 of the substrate 202. The processes and techniques used to form the microelectronic devices are known in the art, and thus not described in detail herein. For example, a CMOS process flow may be implemented to form NMOS and PMOS transistors. The microelectronic devices may combine to form circuits 210 and 220. The circuits 210 and 220 may include transistors, resistors, capacitors, inductors, diodes, and other circuit elements. For the sake of example, the following disclosure will discuss an embodiment where the circuit 210 is a noise-generating (noisy) device and the circuit 220 is a noise-sensitive device.

More specifically, the circuit 210 may be a high speed digital circuit component, such as a clock. Noise may be generated by the circuit 210 due to rapid switching of transistors that make up the circuit. The circuit 220 may be an analog or radio frequency (RF) circuit, such as a low noise amplifier. It has been observed that noise generated by the circuit 210 may be coupled to the circuit 220 through the substrate 202, which adversely affects the performance of the circuit 220. One of the advantages of the present embodiment is that noise coupling from device 210 to device 220 may be substantially reduced and/or eliminated. In other embodiments, the circuit 210 is operable as a high voltage circuit and the circuit 220 is operable as a low voltage circuit (e.g., logic circuit or memory circuit). Accordingly, it would be advantageous to isolate the high voltage circuit from the low voltage circuit to create different power zones in the substrate 202.

Referring to FIG. 2B, an interconnect structure 240 may be formed on the front side 204 of the substrate 202. The interconnect structure 240 is operable to provide interconnections (e.g., wiring) between the various microelectronic devices of the circuits 210 and 220. In the present embodiment, the interconnect structure 240 includes an inter-metal dielectric (IMD) and a multilayer interconnect (MLI) structure formed in a configuration such that the IMD separates and isolates each MLI structure from other MLI structures. The MLI structure includes contacts, vias and metal lines formed over the substrate 202. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The semiconductor device 200 further includes bonding pads 242, 244 that are used to establish electrical connections to the interconnect structure 240 for wafer level testing, wiring, and/or, chip packaging. It is understood that the bonding pads 242, 244 may be extended to various MLI structures (e.g., metal 1, metal 2, etc.) for proper electrical routing. Accordingly, formation of the bonding pads 242, 244 can be integrated with the formation of the MLI structures of the interconnect structure 240.

The method 100 continues with block 130 in which the front side of the semiconductor substrate is bonded to a carrier substrate. A buffer layer 250 is formed on the interconnect structure 240. In the present embodiment, the buffer layer 250 includes a dielectric material such as silicon oxide. Alternatively, the buffer layer 250 may optionally include silicon nitride or epoxy. The buffer layer 250 is formed by CVD, PVD, or other suitable techniques. The buffer layer 250 is planarized to form a smooth surface by chemical mechanical polishing (CMP). A carrier substrate 260 is bonded with the buffer layer 250 so that processing the back side 206 of the substrate 202 can be performed. The carrier substrate 250 is bonded to the semiconductor substrate 202 by molecular forces. The carrier substrate 260 may be similar to the substrate 202 and includes a silicon material. Alternatively, the carrier substrate 260 may optionally include a glass substrate. The carrier substrate 260 provides protection for the various features formed on the front side 204, and also provides mechanical strength and support for processing the back side 206 of the substrate 202 as discussed below. As mentioned above, the buffer layer 250 includes a smooth surface and has better bonding properties than the substrate 202. The buffer layer 250 also provides electrical isolation between the semiconductor substrate 202 and the carrier substrate 260.

The method 100 continues with block 140 in which the semiconductor substrate is thinned from the back side. Still referring to FIG. 2B, a process 230 is performed to thin the substrate 202 from the back side 206. In the present embodiment, the process 230 includes a grinding process, diamond scrubbing process, chemical-mechanical polishing (CMP) process, or other suitable techniques. A substantial amount of substrate material may be removed from the substrate 202 during the process 230. After process 230 is performed, the substrate 202 has a new thickness 208B, which ranges from about 0.5 um to about 20 um. In the present embodiment, the new thickness 208B is less than about 2 um. It is understood that the particular thicknesses disclosed herein are mere examples and that other thicknesses may be implemented depending on the type of application and design requirements of the semiconductor device 200.

The method 100 continues with block 150 in which a trench is formed from the back side to the front side of the semiconductor substrate to isolate the first circuit from the second circuit. Referring now to FIGS. 2C and 2D, illustrated is a cross-sectional view and bottom view, respectively, of the semiconductor device 200 showing trenches 280A and 280B formed to isolate the circuits 210 and 220 from each other, and openings 290 formed to open up and expose the bonding pads 242, 244. For example, a photomask (or reticle) is used in a photolithography process to pattern a photoresist layer and/or a hard mask on the back side 206 of the substrate 202. Using the patterned mask, an etching process such as a dry etching process is performed on the substrate 202 to form a trench 280A surrounding the device 210, a trench 280B surrounding the device 220, and openings 290 exposing the pads 242, 244. Thus, the process to form the trenches 280A, 280B and open up the boding pads 242, 244 can be combined to use the same photomask and patterning process.

In some embodiments, the trenches 280A and 280B may be filled with air. In other embodiments, the trenches 280A and 280B may be filled with an insulator or dielectric material such as silicon oxide, silicon nitride, or other suitable materials. It should be noted that the trenches 280A and 280B completely extend from the back side 206 to the front side 204 of the substrate 202 in the present embodiment. Further, although the trenches 280A and 280B are shown as rectangular in shape, it is understood that the trenches may be shaped as circles, ovals, polygons, irregular shapes, and other suitable shapes. An advantage of the present embodiment is that the trenches 280A and 280B substantially reduce noise coupling between the circuits 210 and 220 through the substrate 202. In another embodiment, the trenches 280A and 280B substantially extend through the substrate 202. In still another embodiment, the trench 280A is formed to enclose and surround the device 210, but the trench 280B may be omitted. In yet another embodiment, the trench 280B is formed to enclose and surround the device 220, but the trench 280A may be omitted.

It is understood that the method 100 may continue with further processing to complete fabrication of the semiconductor device 200. For example, the semiconductor device 200 may undergo wafer level testing, wiring, and chip packaging as is known in the art. It is also understood that although the present embodiment illustrates a noisy circuit 210 and a noise-sensitive circuit 220, the circuits 210 and 220 may both be noisy and/or noise-sensitive in other embodiments.

In summary, the methods and devices disclosed herein provide an effective and efficient approach for isolating devices/circuits from noise or isolating different power zones in a substrate. The present embodiment takes advantage of wafer-bonding and thinning-down technology to form a trench guard ring that extends from the back surface to the front surface of the substrate to completely isolate a device/circuit from other devices/circuits formed in the same substrate. Accordingly, noise coupling between a noisy device and a noise sensitive device through the substrate may be substantially reduced, and incorporating high voltage circuits with low voltage circuits can be achieved in system on chip (SoC) applications. Another advantage is that the process to form the trenches can be incorporated with the process to open up the pads for establishing electrical connections, and thus the same photomask (or reticle) can be used which lowers fabrication costs and saves time.

Thus, the present disclosure discloses a method of fabricating a semiconductor substrate that includes providing a semiconductor substrate having a front side and a back side, forming a first circuit and a second circuit at the front side of the semiconductor substrate, bonding the front side of the semiconductor substrate to a carrier substrate, thinning the semiconductor substrate from the back side, and forming a trench from the back side to the front side of the semiconductor substrate to isolate the first circuit from the second circuit.

The present disclosure also describes a method of fabricating a semiconductor device that includes providing a first substrate having a front side and a back side, forming a device at the front side of the first substrate, forming an interconnect structure over the front side of the first substrate, the interconnect structure including a metal pad, forming a buffer layer over the interconnect structure, bonding the front side of the first substrate to a second substrate with the buffer layer, thinning-down the first substrate from the back side, and etching a trench in the first substrate to isolate the device, the trench surrounding the device and extending from the back side to the front side of the first substrate.

Further, the present disclosure describes a semiconductor device that includes a semiconductor substrate having a front side and a back side, a first circuit and a second circuit formed at the front side of the semiconductor substrate, a carrier substrate bonded to the front side of the semiconductor substrate, and a trench formed in the semiconductor substrate to isolate the first circuit from the second circuit, the trench extending from the back side to the front side of the semiconductor substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first wafer having a first side and a second side that is opposite the first side;
   a first circuit and a second circuit that are both located in the first wafer;
   a second wafer that is coupled to the first wafer from the first side; and
   an isolation structure that surrounds at least one of the first and second circuits, the isolation structure extending through the first wafer.

2. The semiconductor device of claim 1, wherein the isolation structure includes a trench that is filled with one of: a dielectric material and air.

3. The semiconductor device of claim 1, wherein the isolation structure includes:
   a first component that surrounds the first circuit; and
   a second component that surrounds the second circuit.

4. The semiconductor device of claim 1, wherein the isolation structure completely surrounds the at least one of the first and second circuits from a bottom view.

5. The semiconductor device of claim 1, wherein:
   the first circuit includes a noisy circuit; and
   the second circuit includes a noise-sensitive circuit.

6. The semiconductor device of claim 1, wherein the first circuit and second circuit operate under different power levels.

7. The semiconductor device of claim 1, wherein the first wafer has a thickness that is in a range from about 0.5 microns to about 20 microns.

8. The semiconductor device of claim 1, wherein:
   the first and second circuits are located closer to the first side than to the second side; and
   an interconnect structure is located between the first and second wafers.

9. A semiconductor device, comprising:
   a device substrate having a thickness that is no greater than about 20 microns;
   a first circuit and a second circuit disposed in the device substrate, the first and second circuits being different types of circuits;
   an interconnect structure disposed on the device substrate, the interconnect structure being electrically coupled to the first and second circuits;
   a carrier substrate bonded to the device substrate in a manner such that the interconnect structure is disposed between the carrier substrate and the device substrate; and
   an isolation device that surrounds at least one of the first and second circuits, the isolation device including a trench that is filled with one of: a dielectric material and air.

10. The semiconductor device of claim 9, wherein the isolation device substantially extends through the device substrate.

11. The semiconductor device of claim 9, wherein the isolation device surrounds each of the first and second circuits in 360 degrees.

12. The semiconductor device of claim 9, wherein the isolation device includes a trench that is filled with one of: a dielectric material and air.

13. The semiconductor device of claim 9, wherein one of the first and second circuits includes a noise-generating circuit, and the other one of the first and second circuits includes a noise-sensitive circuit.

14. A semiconductor device, comprising:
 a semiconductor substrate having a front side and a back side;
 a first circuit and a second circuit formed at the front side of the semiconductor substrate;
 a carrier substrate bonded to the front side of the semiconductor substrate; and
 a trench formed in the semiconductor substrate to isolate the first circuit from the second circuit, the trench extending from the back side to the front side of the semiconductor substrate.

15. The semiconductor device of claim 14, wherein the semiconductor substrate has a thickness less than about 2 um.

16. The semiconductor device of claim 14, further comprising:
 an interconnect structure formed on the front surface of the semiconductor substrate to provide interconnections for the first and second circuits; and
 a buffer layer disposed between the interconnect structure and the carrier substrate.

17. The semiconductor device of claim 14, wherein the trench is filled with a dielectric material.

18. The semiconductor device of claim 14, wherein the trench is filled with air.

19. The semiconductor device of claim 14, wherein the first circuit and the second circuit are each one of a high speed digital circuit, an analog circuit, and an RF circuit.

20. The semiconductor device of claim 14, wherein the first circuit is operable at a different voltage than the second circuit.

* * * * *